United States Patent
Delbecq et al.

(10) Patent No.: US 9,438,358 B2
(45) Date of Patent: Sep. 6, 2016

(54) RECEIVER UNIT AND METHOD FOR CORRECTING A VALUE OF A RECEIVE SIGNAL STRENGTH INDICATOR

(75) Inventors: Dominique Delbecq, Fonsorbes (FR); Fares Jaoude, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 70 days.

(21) Appl. No.: 14/423,724

(22) PCT Filed: Sep. 14, 2012

(86) PCT No.: PCT/IB2012/002022
§ 371 (c)(1),
(2), (4) Date: Feb. 25, 2015

(87) PCT Pub. No.: WO2014/041387
PCT Pub. Date: Mar. 20, 2014

(65) Prior Publication Data
US 2015/0207577 A1    Jul. 23, 2015

(51) Int. Cl.
*H04B 17/00* (2015.01)
*H04B 17/21* (2015.01)
*H04B 17/318* (2015.01)
(Continued)

(52) U.S. Cl.
CPC .............. *H04B 17/21* (2015.01); *H03G 3/005* (2013.01); *H04B 1/12* (2013.01); *H04B 1/16* (2013.01); *H04B 17/0085* (2013.01); *H04B 17/318* (2015.01)

(58) Field of Classification Search
None
See application file for complete search history.

(56) References Cited

U.S. PATENT DOCUMENTS

| | | |
|---|---|---|
| 7,149,488 B2 | 12/2006 | Khorram |
| 7,454,189 B2 | 11/2008 | Kim |

(Continued)

OTHER PUBLICATIONS

International Search Report and Written Opinion correlating to PCT/IB2012/002022 dated Apr. 4, 2013.

*Primary Examiner* — Lana N Le (57) ABSTRACT

A receiver unit comprising a mixer, a test signal unit, a multiplexer unit, an amplifier unit, a signal strength unit, and a digital control unit is described. The mixer may be arranged to downconvert a received radio-frequency signal to an intermediate frequency, thereby generating a reception signal having the intermediate frequency. The multiplexer unit may be connected to the mixer and to the test signal unit and arranged to select, among the reception signal and a test signal, a multiplexer output signal in dependence on an operating signal. The amplifier unit may be connected to the multiplexer unit and arranged to amplify the multiplexer output signal, thereby generating an amplified signal. The signal strength unit may be connected to the amplifier unit and arranged to generate a signal strength indicator indicative of a signal strength of the amplified signal. The control unit may be connected to the signal strength unit and arranged to generate the operating signal in accordance with an operating cycle, the operating cycle comprising one or more test phases and a reception phase. The test signal unit may be connected to the control unit and arranged to generate the test signal in dependence on the operating signal, the test signal having the intermediate frequency. The control unit may be further arranged to: gather, in each of the test phases, a test value of the signal strength indicator, thus gathering one or more test values; determine a numerical transformation on the basis of the one or more test values; gather, in the reception phase, a reception value of the signal strength indicator; and compute a corrected signal strength value by applying the transformation to the reception value.

12 Claims, 5 Drawing Sheets

(51) Int. Cl.
  *H03G 3/00* (2006.01)
  *H04B 1/12* (2006.01)
  *H04B 1/16* (2006.01)

(56) References Cited

U.S. PATENT DOCUMENTS

| | | | | |
|---|---|---|---|---|
| 8,135,094 B2 * | 3/2012 | Gorday | ............ | H04L 25/03006 329/304 |
| 8,498,579 B2 * | 7/2013 | Yonge, III | ........ | H04W 74/0808 370/230 |
| 9,350,470 B1 * | 5/2016 | Anderson | .............. | H04B 17/21 |
| 2005/0260963 A1 * | 11/2005 | Ponce De Leon | ..... | H04B 17/20 455/226.3 |
| 2007/0207758 A1 * | 9/2007 | Qi | .......................... | H04B 17/29 455/226.2 |
| 2009/0233566 A1 | 9/2009 | Li et al. | | |
| 2010/0003939 A1 | 1/2010 | Kong et al. | | |
| 2011/0165851 A1 * | 7/2011 | Harada | .................. | H04B 7/086 455/226.1 |
| 2013/0054169 A1 * | 2/2013 | Neidhardt | .......... | H04B 17/0085 702/69 |
| 2013/0054175 A1 * | 2/2013 | Saloio, Jr. | ............ | G01H 1/006 702/105 |

\* cited by examiner

RECEIVER UNIT AND METHOD FOR CORRECTING A VALUE OF A RECEIVE SIGNAL STRENGTH INDICATOR

FIELD OF THE INVENTION

This invention relates to a receiver unit and a method for correcting a value of a receive signal strength indicator.

BACKGROUND OF THE INVENTION

In the field of wireless telecommunications, a receiver is a device for processing a radio frequency signal received from, e.g., an antenna. A receiver may be arranged to provide in addition to processing the received signal, a receive signal strength indicator (RSSI). The RSSI is a signal, for example, a voltage level, for indicating a strength of the received signal. The RSSI may, for instance, be a voltage level proportional to a logarithm of the radio frequency (RF) input power. The RSSI may, for instance, be used to control a gain of the receiver or to decide whether or not the receiver should enter an idle state.

SUMMARY OF THE INVENTION

The present invention provides a receiver unit and a method for correcting a value of a receive signal strength indicator as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
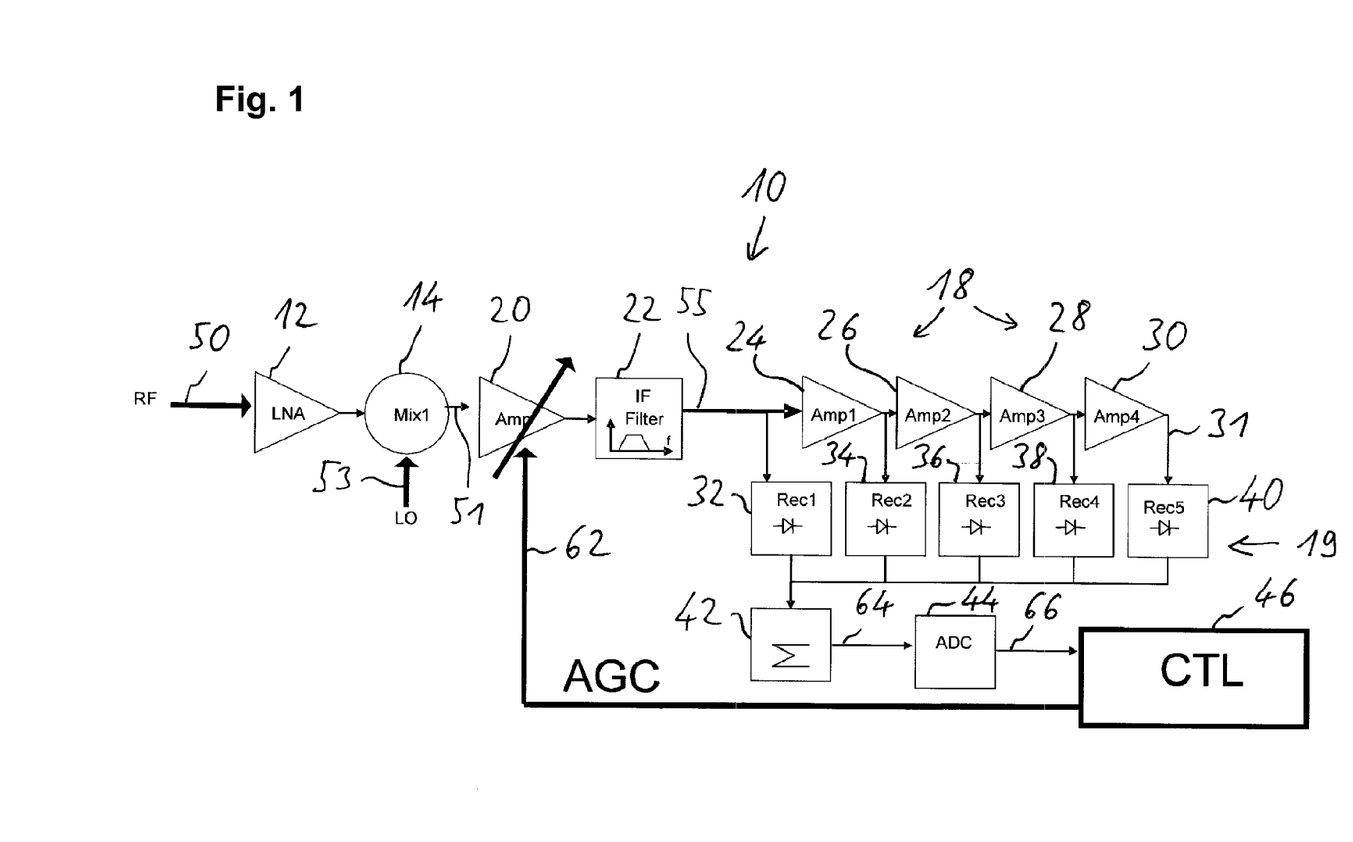
FIG. 1 schematically shows an example of an embodiment of a receiver.

The example of a receiver unit 10 shown in FIG. 1 may comprise, for example, a front end amplifier 12, a mixer 14, a variable gain amplifier 20, an intermediate frequency (IF) filter 22, an amplifier unit 18, a signal strength unit 19 (RSSI unit), and a control unit 46. The amplifier unit 18 may comprise, for instance, an amplifier or more than one amplifier connected in series. In the shown example, the amplifier unit 18 comprises a first amplifier 24, a second amplifier 26, a third amplifier 28, and a fourth amplifier 30 connected in series. The signal strength unit 19 may comprise, for example, a set of rectifiers connected to various branch off points of the amplifier chain 24, 26, 28, 30. In the present example, the RSSI unit 19 may comprise, for instance, a set of five rectifiers 32, 34, 36, 38, and 40. Each of these rectifiers may be connected to a specific node on the signal path through the amplifier chain 24, 26, 28, 30. For example, the rectifiers 32, 34, 36, 38, and 40 may be connected to the output of the IF filter 22, the output of the amplifier 24, the output of the amplifier 26, the output of the amplifier 28, and the output of the amplifier 30, respectively. The RSSI unit 19 may further comprise an adder 42 and an analog to digital conversion unit (analog to digital converter or ADC) 44. The adder 42 may have an input connected to each output of the rectifiers 32, 34, 36, 38, and 40. The ADC 44 may have an input connected to an output of the adder 42. The ADC 44 may further have an output connected to an input of the control unit 46.

The receiver 10 shown in FIG. 1 may operate as follows. The front end amplifier 12 may receive a radio frequency signal 50 from, e.g., an antenna (not shown). The amplifier 12 may amplify the received signal 50 and feed the amplified signal to the mixer 14. The mixer 14 may downconvert the received signal to generate a downconverted frequency signal 51. The mixer 14 may, for instance, be connected to a local oscillator (not shown) and arranged to mix the received RF signal 50 with a local oscillator signal 53 generated by the local oscillator. The local oscillator may have a fixed or a tunable frequency.

The amplifier 20 may amplify the downconverted frequency signal 51. In the shown example, the amplifier 20 may be responsive to an automatic gain control (AGC) signal 62 generated by the control unit 46. The control unit 46 may, for instance, be arranged to control a gain of the amplifier 20 in order to compensate for fluctuations of the power of the received signal 50.

The amplified downconverted signal 51 output by the amplifier 20 may be further fed to the IF filter 22. The IF filter 22 may transfer only a selected part of the spectrum of the downconverted frequency signal 51. The selected part may be centered about a fixed frequency known as the intermediate frequency (IF).

The filtered downconverted signal 55 (intermediate frequency signal) may be further fed to the amplifier unit 18. The amplifier unit 18 may amplify the intermediate frequency signal 55 to generate an output signal 31. The output signal 31 may be further fed to a demodulator unit (not shown), for example, to extract information modulated in the output signal 31.

The adder 42 may add the signals from the rectifier units 32, 34, 36, 38, and 40 to generate an analog RSSI 64. The analog RSSI may, for instance, be a voltage level which may be more or less proportional to a strength, e.g., the logarithm of the power of the intermediate frequency signal 55. The analog RSSI 64 may be fed to the ADC 44 to generate a digital RSSI 66. The digital RSSI 66 may, for instance, be a digital number representing the analog RSSI 64.

The control unit 46 may be responsive to the digital RSSI 66. For instance, the control unit 46 may generate an automatic gain control signal 62 in dependence on the digital RSSI 66 to adjust the gain of the amplifier 20 in dependence on the digital RSSI. For instance, when the digital RSSI 66 increases, the control unit 46 may reduce the gain of the amplifier 20. Similarly, when the digital RSSI 66 decreases, the control unit 46 may increase the gain of the amplifier 20.

In another example (not shown), the receiver unit 10 may lack the variable gain amplifier 20, and the control unit 46 may be arranged to power the receiver unit 10 off when the RSSI 66 is below a minimum required RSSI level, for example.

Figure 2:
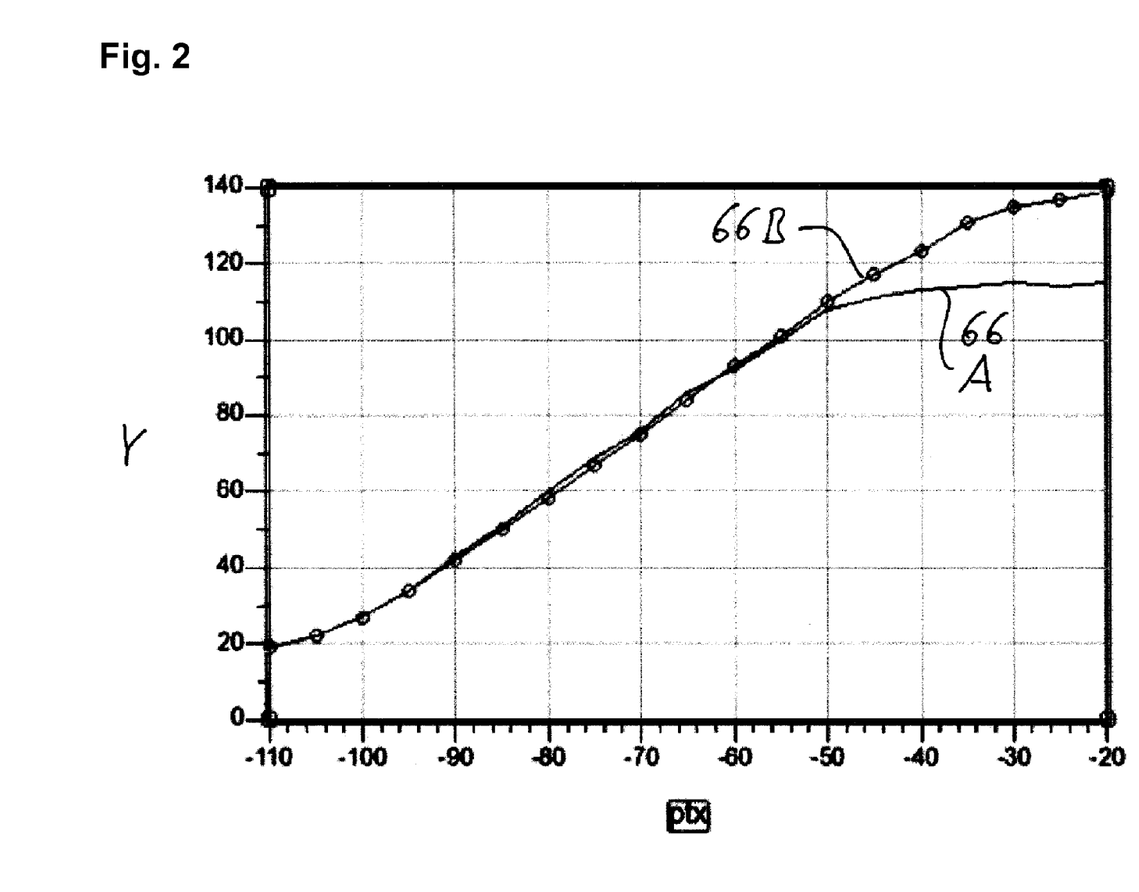
FIG. 2 shows an example of a diagram representing a RSSI as a function of a logarithm, the power of the received RF signal for a first design and a second design, respectively.

Referring now to FIG. 2, the RSSI 66 output by, e.g., the ADC 44 is plotted as a function of a logarithm of the power of, e.g., the intermediate frequency signal 55. The continuous line A refers to a scenario in which the gain of the amplifier 20 is kept constant or to a design in which the variable gain amplifier 20 is absent. The dotted line B refers to a scenario in which the gain of the variable gain amplifier 20 is varied in dependence on the RSSI 66.

Ideally, the RSSI (the Y value in the plot) may be proportional to the logarithm of the power of the IF signal. Yet the graphs A and B show a marked deviation from such a linear behavior for higher input power levels. This deviation may be explained by a saturation of the ultimate amplifier of the amplifier unit 18. In the example of graph A in FIG. 2, the amplifier unit 18 may become saturated for input power levels above −50. This saturation effect may be counteracted by increasing the gain of the amplifier 20 as shown by graph B. Nevertheless, the graph B also deviates from a straight line in the case of a sufficiently high input power, e.g., for an input power level greater than −30 in the present example.

Saturation effects and a corresponding non-linear variation of the computed RSSI 66 may be one problem. Another problem which may not be apparent from FIG. 2 may be that the RSSI 66, when considered as a function of the input signal strength may have an incorrect offset or an incorrect slope or both even in the linear domain, e.g., in the range of −90 to −50 in FIG. 2. In other words, although the computed RSSI may qualitatively behave correctly, at least on a fairly large range of the input signal strength, the RSSI values may be incorrect when considered against an absolute reference. Such absolute error of the RSSI may be due to, for instance, temperature variations, aging effects, and process spread. Even when the device 10 has been calibrated to produce the correct RSSI values, the computed RSSI may drift away from the correct value when the temperature of the device 10 changes or as the result of aging. However, there are telecommunication applications which require an accurate RSSI measurement. For a Zigbee application, for instance, the acceptable spread may be about +−5 dBm. The example of a receiver 10 shown in FIG. 3 may differ from the one shown in FIG. 1 in that it may further comprise a multiplexer 16, a test signal unit 48, and in that the control unit 46 may be further arranged to control the test signal unit 48, the multiplexer 16, and the variable gain amplifier 20 in accordance with an operating cycle. The operating cycle may comprise one or more test phases and a reception phase. More specifically, the multiplexer 16 may be connected to the mixer 14 and to the test signal unit 48 and arranged to select, among the downconverted signal 54 and a test signal 56, a multiplexer output signal 58 in dependence on an operating signal 60. The multiplexer output signal 58 may thus be, for example, either the downconverted signal 54 or the test signal 56. The amplifier unit 18 may be connected to the multiplexer unit 16 and arranged to amplify the multiplexer output signal 58, thereby generating the amplified signal 31. The amplified signal 31 may be further processed, e.g., demodulated (not shown).

Figure 3:
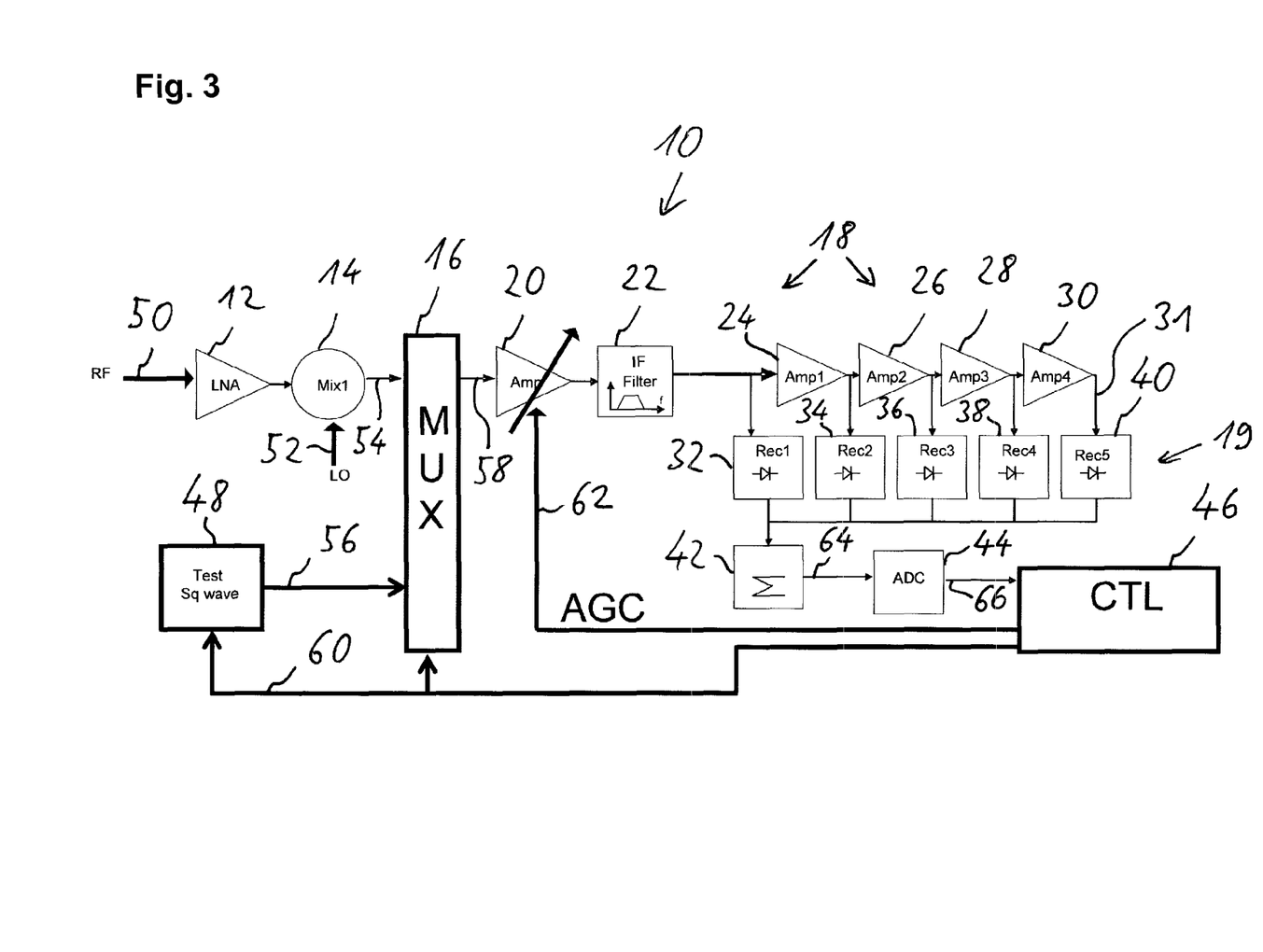
FIG. 3 schematically shows an example of an embodiment of another receiver.

The signal strength unit 19 may be connected to the amplifier unit 18 and arranged to generate the signal strength signal 66 (digital RSSI). The RSSI 66 may be indicative of a signal strength of the amplified signal 31. The digital control unit 46 may be connected to the signal strength unit 19 and arranged to generate the operating signal 60 in accordance with said operating cycle. The test signal unit 48 may be connected to the control unit 46 and arranged to generate the test signal 56 in dependence on the operating signal 60. The test signal 56 may have said intermediate frequency.

The control unit 46 may be further arranged to gather in each of said test phases a test value of the signal strength signal 66. The control unit 46 may further gather in the reception phase a reception value of the RSSI 66 and compute a corrected signal strength value by applying a transformation to the reception value. This transformation may depend on the test signal strength values. The test signal unit 48 may, for instance, comprise one or more oscillators for generating the test signal 56. The test signal unit 48 may be arranged to be relatively insensitive to changing operating conditions such as temperature. The test signal unit 48 may further be arranged to ensure a high accuracy of the signal strength of the test signal 56.

The receiver 10 in FIG. 3 may, for instance, operate as follows. In a first test phase, the control unit 46 may control the test unit 48 to generate the test signal 56 with a first strength. An amplitude of the test signal 56 during the first test phase may, for instance, be 0.12 volts. The control unit 46 may further control the multiplexer 16 in the first test phase to select the test signal 56 as the multiplexer output signal 58. As a result, the signal strength unit 19 may generate an RSSI 66 on the basis of the test signal 56 of the first test phase. The control unit 46 may further gather a value of the RSSI 66 as a first test value YM1. As the strength of the test signal 56 during the first test phase may be known, a corresponding correct RSSI, i.e., an expected signal strength value, may also be known and may be compared to the first test signal strength value YM1 to determine a transformation that can be used in a subsequent reception phase to correct the signal strength values generated by the signal strength unit 19 in the reception phase.

The first test phase may be followed by a second test phase in which the control unit 36 may control the test signal unit 48 to generate the test signal 56 with a signal strength different from the test signal strength of the first test phase. For instance, the test signal 56 may have an amplitude of, e.g., 1.2 volt in the second test phase (compared to, e.g., 0.12 volt of the first test phase). The control unit 46 may further gather a second test value YM2 of the RSSI 66 during the second test phase. The control unit 46 may thus determine said transformation on the basis of both the first test signal strength value YM1 and the second test signal strength value YM2.

The operating cycle may comprise further test phases. For instance, the control unit 46 may be arranged to set the gain of the variable gain amplifier 20 to different stationary values during each of one or more test phases subsequent to the first and second test phase. For each test phase, the control unit 46 may acquire a corresponding test signal value YM from the signal strength unit 19. Each test phase may have associated with it an expected signal strength value YT. The control unit 56 may thus determine the RSSI transformation such that transforming the acquired test signal strength values, e.g., YM1, YM2, YM3, etc., yields the corresponding expected signal strength values, e.g., YT1, YT2, YT3, etc.

Depending on the number of free parameters specifying the RSSI transformation, an exact match between the test signal strength values and the corresponding expected signal strength values may be achieved or not. For example, the RSSI transformation may have a number of parameters equal to the number of test phases. In this case, exact agreement between the test signal strength values and the corresponding expected signal strength values may be achieved. In another example, there may be more test phases than RSSI transformation parameters. For example, there may be three test phases and only two adjustable parameters. The transformation may then be determined by means of a best fit.

Figure 4:
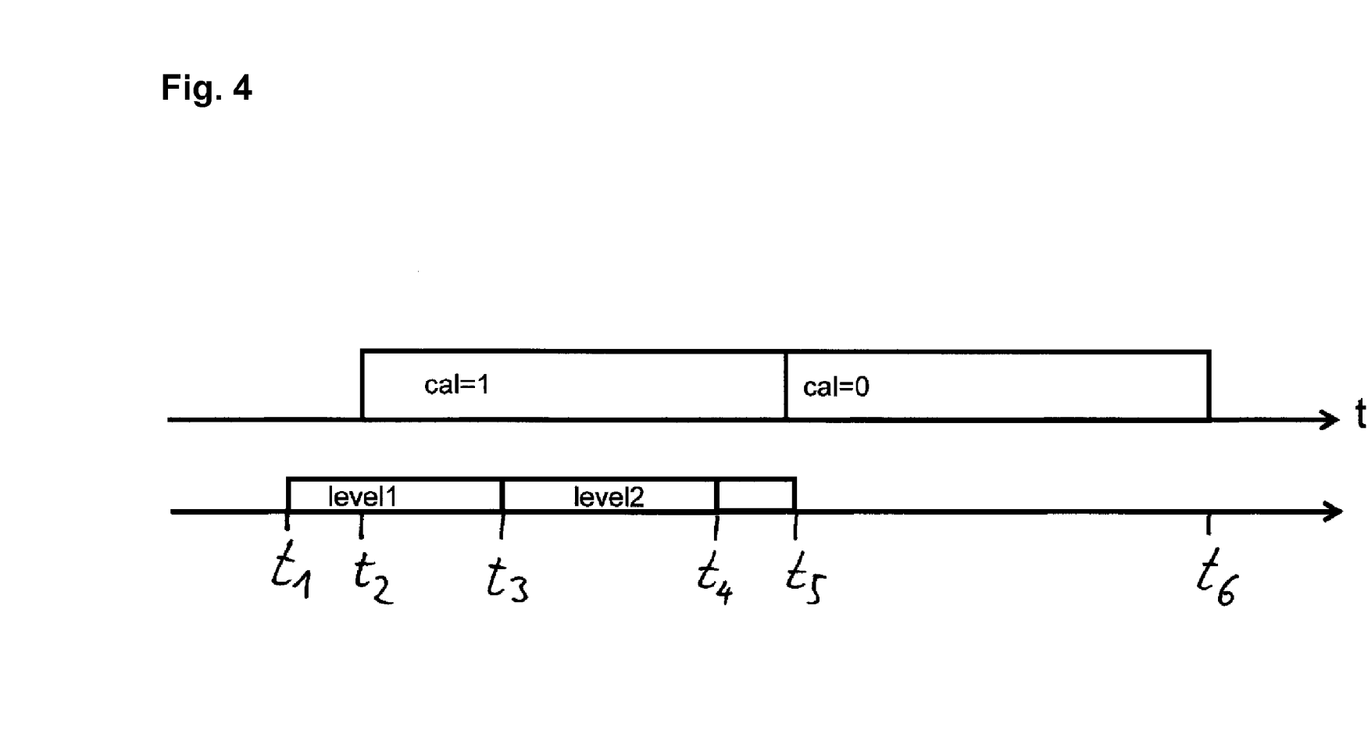
FIG. 4 schematically shows an example of an embodiment of an operating cycle of a receiver.

Referring now to FIG. 4, an example of an operating cycle is schematically illustrated. The arrows represent the flow of time t. The operating cycle may comprise a first test phase t1 to t3 and a second test phase t3 to t4. The strength of the test signal 56 may have a first stationary value during the first test phase t1 to t3 and a different (e.g., higher or lower) value during the second test phase t3 to t4. In the shown example, the operating cycle may comprise no further test phases after time t4. However, in another example (not shown), the operating cycle may comprise more than two test phases. In the shown example, the operating cycle further comprises an evaluation phase t4 to t5 subsequent to the second test phase t3 to t4. In the evaluation phase, the control unit 46 may compute the RSSI transformation on the basis of the test signal strength values YM1 and YM2 of the first and second test phases and on the basis of the corresponding expected signal strength values YT1 and YT2. During a phase t2 to t5, the multiplexer 16 may transfer the test signal from the test signal unit 48. This phase may also be referred to as the calibration phase may be followed by a reception phase t5 to t6. During the reception phase t5 to t6, the multiplexer 16 may transfer the reception signal 54.

Figure 5:
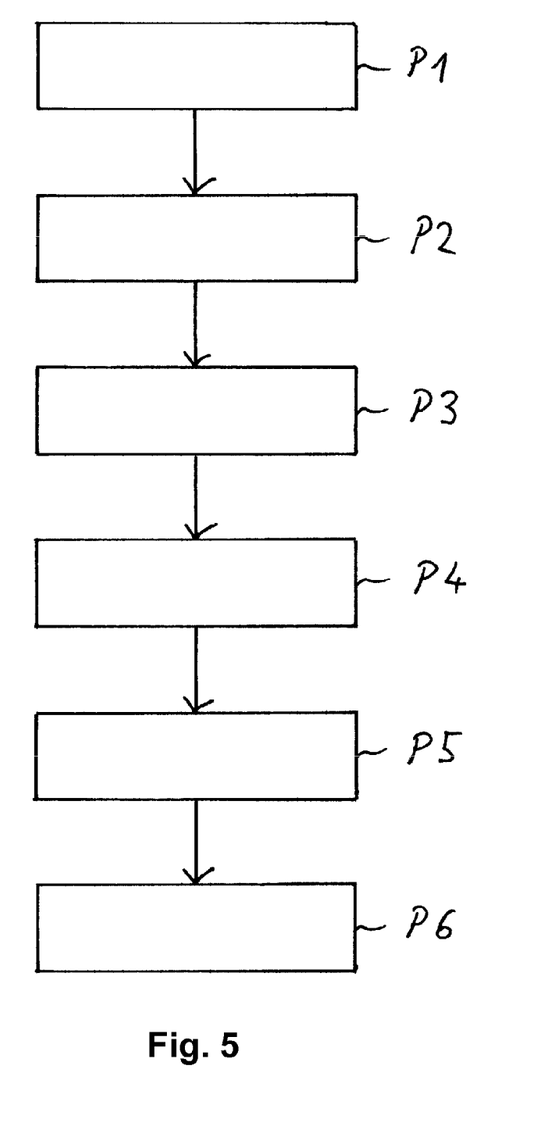
FIG. 5 shows a flow chart of an example of an embodiment of a method of generating an RSSI.

An example of operating the receiver 10 is further described in reference to the flow chart of FIG. 5. In block P1, the test signal unit 48 may be turned on, and the multiplexer 16 may be set to transfer the test signal 56. A signal strength of the test signal 56 may then be set to a first level (level 1), and a corresponding test signal strength value YM1 may be determined by, e.g., the control unit 46. Level 1 may correspond to a test signal amplitude of 0.12 volt, for example. The test signal strength may then be set to a second level (level 2), corresponding to, e.g., an amplitude of 1.2 volt. A corresponding test signal strength value YM2 may be acquired by, e.g., the control unit 46 (block P3).

Furthermore, in one or more subsequent test phases, the gain of the amplifier 20 may be set to selected test levels. Corresponding test signal strength values, e.g., YM3 and YM4, may be determined by, e.g., the control unit 46 (block P4). In one example, the operating cycle comprises the test phases 1, 2, and 3 and no further test phases.

Each test phase may be characterized by a distinct combination of the level of the test signal 56 and one or more values of some other operating parameter of the receiver 10. Such other parameters may notably include the gain of the amplifier 20. For example, the test phases 1, 2, and 3 may be characterized by the following test values:

Test phase 1: test signal amplitude (TSA)=0.12 volts, gain=1;
Test phase 2: TSA=0.12 volt, gain=1;
Test phase 3: TSA=1.2 volt, gain=10.

The values of one or more parameters of a RSSI transformation may be determined from the acquired test signal strength values. This determination may be based on a set of expected signal strength values associated with a set of test phases (block P5).

In a subsequent reception phase (block P6), the transformation may be used to correct the RSSI values acquired during the reception phase.

The RSSI transformation may, for instance, be defined as follows: YT=A*YM+B, wherein YM may be an RSSI value, e.g. a value of the RSSI 66 in FIG. 3, and YT may be a corrected RSSI value. The control unit 46 may determine the parameters A and B on the basis of the test signal strength values, e.g., YM1 and YM2, of the first and second test phases. For instance, A and B may be determined by matching YT(YM1) and YT(YM2) to expected RSSI values YT1 and YT2:

$$A*YM1+B=YT1$$

$$A*YM2+B=YT2.$$

Solving for A and B gives:

$$A=(YT1-YT2)/(YM1-YM2)$$

$$B=(-YM2*YT1+YM1*YT2)/(YM1-YM2).$$

It is noted that both A and B may further be determined on the basis of other operating parameters, such as the gain of the amplifier 20, for instance. Equivalently, A and B may be computed from data equivalent to the expected RSSI values YT1 and YT2.

Applying this transformation to a value YMR of the RSSI 66 of, e.g., the reception phase, results in a corrected signal strength value YTR=A*YMR+B.

It is noted that the corrected signal strength value YTR thus computed may be exact if the value of the generated RSSI 66 depends on the strength of the reception signal 54 in a linear manner, that is, if YM(X)=AM*X+BM wherein X is the strength of the reception signal 54, AM is a slope, and BM is an offset.

Otherwise, that is, when YM(X) cannot be expressed as YM(X)=AM*X+BM, the corrected value YTR=A*YMR+B may be not exact but still closer to the exact value than YMR.

In another example, the transformation may be: YT=A*YM+B+BG, wherein A and B may be defined as above and BG may be an additional offset. This additional offset BG may be a function of, e.g., the gain of the amplifier 20. The control unit 46 may, for instance, determine an offset value BG for each gain value among a set of gain values by performing a respective test phase for each of these gain values. For instance, a test signal strength value may be determined for each of these gain values and a constant amplitude of the test signal 56.

The control unit 46 may comprise logic circuitry and memory elements (not shown) for determining the RSSI operation and for applying it to the RSSI values 66 received in the reception phase. The control unit 46 may notably comprise a microprocessor. The control unit 46 may notably comprise a memory unit in which said expected signal strength values are stored. The memory unit may be a read and write memory unit, thus allowing a user to update the expected signal strength values. The expected signal strength values may thus be calibrated if necessary.

It is pointed out that the proposed calibration scheme may involve, as a key aspect, a numerical transformation of a digital RSSI value. Thus, the RSSI may be corrected without a need for tuning any analog signals. The only unit which may still require an analog calibration may be the test signal unit 48. However, calibrating the test signal unit 48 to ensure that it generates test signals having the correct amplitude may be a fairly simple task because the test signal unit 48 may comprise relatively simple circuitry. Notably, in contrast to the circuit shown in FIG. 1, the test unit 48 may be free of any amplifiers. Calibration problems typically associated with amplifier units may thus be avoided.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on transitory or non-transitory computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Also for example, in one embodiment, the illustrated examples may be implemented as circuitry located on a single integrated circuit or within a same device. For example, the units shown in the figures may be located within a single integrated circuit (IC). Alternatively, the examples may be implemented as any number of separate integrated circuits or separate devices interconnected with each other in a suitable manner. For example, the control unit 46 may be located within a separate IC.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A receiver unit, comprising a mixer, a test signal unit, a multiplexer unit, an amplifier unit, a signal strength unit, and a digital control unit;
   said mixer arranged to downconvert a received radio-frequency signal to an intermediate frequency, thereby generating a reception signal having said intermediate frequency;
   said multiplexer unit connected to said mixer and to said test signal unit and arranged to select, among said reception signal and a test signal, a multiplexer output signal in dependence on an operating signal;
   said amplifier unit connected to said multiplexer unit and arranged to amplify said multiplexer output signal, thereby generating an amplified signal;
   said signal strength unit connected to said amplifier unit and arranged to generate a signal strength indicator indicative of a signal strength of said amplified signal;
   said control unit connected to said signal strength unit and arranged to generate said operating signal in accordance with an operating cycle, said operating cycle comprising one or more test phases and a reception phase;
   said test signal unit connected to said control unit and arranged to generate said test signal in dependence on said operating signal, said test signal having said intermediate frequency;
   said control unit further arranged to:
   gather, in each of said test phases, a test value of said signal strength indicator;
   determine a numerical transformation on the basis of said one or more test values;
   gather, in said reception phase, a reception value of said signal strength indicator; and
   compute a corrected signal strength value by applying said transformation to said reception value.

2. The receiver unit of claim 1, said control unit arranged to control a gain of said amplifier unit such that said gain is stationary during each of said test phases.

3. The receiver unit of claim 1, said control unit arranged to set a gain of said amplifier unit to a first value in a first one of said test phases and to a different second value in a second one of said test phases.

4. The receiver unit of claim 1, said transformation depending parametrically on one or more parameters, said control unit arranged to fit said parameters such that said transformation applied to said one or more test signal strength values reproduces one or more expected signal strength values to a best possible extent.

5. The receiver unit of claim 4, said control unit comprising a memory unit, said expected signal strength values or equivalent values stored in said memory unit.

6. The receiver unit of claim 5, said memory unit being a read-only memory unit.

7. The receiver unit of claim 5, said memory unit being a read-and-write memory unit.

8. The receiver unit of claim 1, wherein said transformation is:

$$YT = A*YM + B$$

A being a slope, B being an offset, said control unit arranged to compute said slope A and said offset B on the basis of said one or more test signal strength values and one or more expected signal strength values.

9. The receiver unit of claim 1, said test signal having a stationary amplitude during each of said test phases.

10. The receiver unit of claim 9, said stationary amplitude having a first value during a first one of said test phases and a different second value during a second one of said test phases.

11. The receiver unit of claim 1, said control unit further arranged to control a gain of said amplifier unit during said reception phase in dependence on said corrected signal strength value.

12. A method of generating a corrected signal strength indicator, comprising:
   downconverting a received radio-frequency signal to an intermediate frequency, thereby generating a reception signal having said intermediate frequency;
   selecting, among said reception signal and a test signal, a multiplexer output signal in dependence on an operating signal;
   amplifying said multiplexer output signal, thereby generating an amplified signal;
   generating a signal strength indicator indicative of a signal strength of said amplified signal;
   generating said operating signal in accordance with an operating cycle, said operating cycle comprising one or more test phases and a reception phase;
   generating said test signal in dependence on said operating signal, said test signal having said intermediate frequency;
   gathering, in each of said test phases, a test value of said signal strength indicator;
   determining a numerical transformation on the basis of said one or more test values;
   gathering, in said reception phase, a reception value of said signal strength indicator; and
   computing a corrected signal strength value by applying said transformation to said reception value.

* * * * *